(12) United States Patent
Lee et al.

(10) Patent No.: US 7,511,581 B2
(45) Date of Patent: Mar. 31, 2009

(54) WIDE-BAND MULTIMODE FREQUENCY SYNTHESIZER AND VARIABLE FREQUENCY DIVIDER

(75) Inventors: Ja Yol Lee, Daejeon (KR); Kwi Dong Kim, Daejeon (KR); Chong Ki Kwon, Daejeon (KR); Jong Dae Kim, Daejeon (KR); Sang Heung Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 159 days.

(21) Appl. No.: 11/634,004

(22) Filed: Dec. 5, 2006

(65) Prior Publication Data

US 2007/0132515 A1 Jun. 14, 2007

(30) Foreign Application Priority Data

Dec. 8, 2005 (KR) ............... 10-2005-0119530
Aug. 7, 2006 (KR) ............... 10-2006-0074089

(51) Int. Cl.
*H03L 7/00* (2006.01)

(52) U.S. Cl. .................. 331/34; 331/1 A; 331/16; 331/179; 327/115; 327/117; 327/157; 327/159; 377/47

(58) Field of Classification Search .......... 331/16, 331/34, 179, 1 A; 327/115, 157, 117, 159; 377/47
See application file for complete search history.

(56) References Cited

U.S. PATENT DOCUMENTS 6,747,519 B2 6/2004 Jaehne et al. ............ 331/16

(Continued)

FOREIGN PATENT DOCUMENTS

KR 1019960009972 7/1996

(Continued)

OTHER PUBLICATIONS

Korean Notice of Patent Grant dated Feb. 25, 2008 for the corresponding KR10-2006-0074089.

*Primary Examiner*—Arnold Kinkead
(74) *Attorney, Agent, or Firm*—Ladas & Parry LLP (57) ABSTRACT

A wide-band multimode frequency synthesizer using a Phase Locked Loop (PLL) is provided. The multiband frequency synthesizer includes a multimode prescaler, a phase detector/a charge pump, a swallow type frequency divider, and a switching bank LC tuning voltage-controlled oscillator having wide-band and low phase noise characteristics. The multimode prescaler operates in five modes and divides a signal up to 12 GHz. The wide-band frequency synthesizer can be used in various fields such as WLAN/HYPERLAN/DSRC/UWB systems that operate in the frequency range from 2 GHz to 9 GHz. The wide-band multimode frequency synthesizer includes a frequency/phase detector for comparing a frequency and phase of a reference high-frequency signal with a frequency and phase of a feedback high-frequency signal; a charge pump for producing an output current corresponding to the result of the comparison performed by the frequency/phase detector; a loop filter for producing an output voltage corresponding to an accumulated value of the output current of the charge pump; a voltage-controlled oscillator for generating an oscillation signal having a frequency corresponding to the output voltage of the loop filter; and a variable frequency divider for dividing an output signal of the voltage-controlled oscillator by a designated integer value, and outputting the result as a feedback signal, wherein at lease two of an amount of unit pumping charges of the charge pump, an RLC value of the loop filter, an RLC value of the voltage-controlled oscillator, and a divisor value of the variable frequency divider are controlled according to a band.

5 Claims, 5 Drawing Sheets

U.S. PATENT DOCUMENTS

| | | | | |
|---|---|---|---|---|
| 6,956,440 | B2 * | 10/2005 | Choi | 331/1 A |
| 7,282,969 | B2 * | 10/2007 | Shin et al. | 327/115 |
| 2003/0218231 | A1 | 11/2003 | Sani et al. | |

FOREIGN PATENT DOCUMENTS

| | | |
|---|---|---|
| KR | 1020010044897 | 6/2001 |
| KR | 1020040009795 | 1/2004 |
| KR | 1020040039715 | 5/2004 |
| KR | 1020040055085 | 6/2004 |
| KR | 1020050067629 | 7/2005 |
| KR | 1020050069297 | 7/2005 |

* cited by examiner

WIDE-BAND MULTIMODE FREQUENCY SYNTHESIZER AND VARIABLE FREQUENCY DIVIDER

CROSS-REFERENCE TO RELATED APPLICATION

This application claims priority to and the benefit of Korean Patent Application Nos. 2005-119530, filed Dec. 8, 2005, and 2006-74089, filed Aug. 7, 2006, the disclosures of which are incorporated herein by reference in their entirety.

BACKGROUND

1. Field of the Invention

The present invention relates to a multimode frequency synthesizer using a phase-locked loop (PLL) that can be installed in 802.11 b/g HYPERLAN (HIgh PErformance Radio LAN), Dedicated Short Range Communications (DSRC), 802.11 a, and Ultra Wide Band (UWB) systems having applications in a 2~9 GHz frequency band.

2. Discussion of Related Art

Recently, as mobile communication services are becoming increasingly widespread, available frequency bands are becoming saturated, and several terminals are required to enjoy various mobile communication services. As a result, developers all over the world are working on a reconfigurable mobile communication system capable of reconfiguring mobile communication services in software and enabling access to various mobile communication services using one terminal regardless of encoding and decoding method. To access necessary services using one terminal regardless of time and place, a wide-band Radio Frequency (RF) transceiver of a mobile communication system is required.

Figure 8:
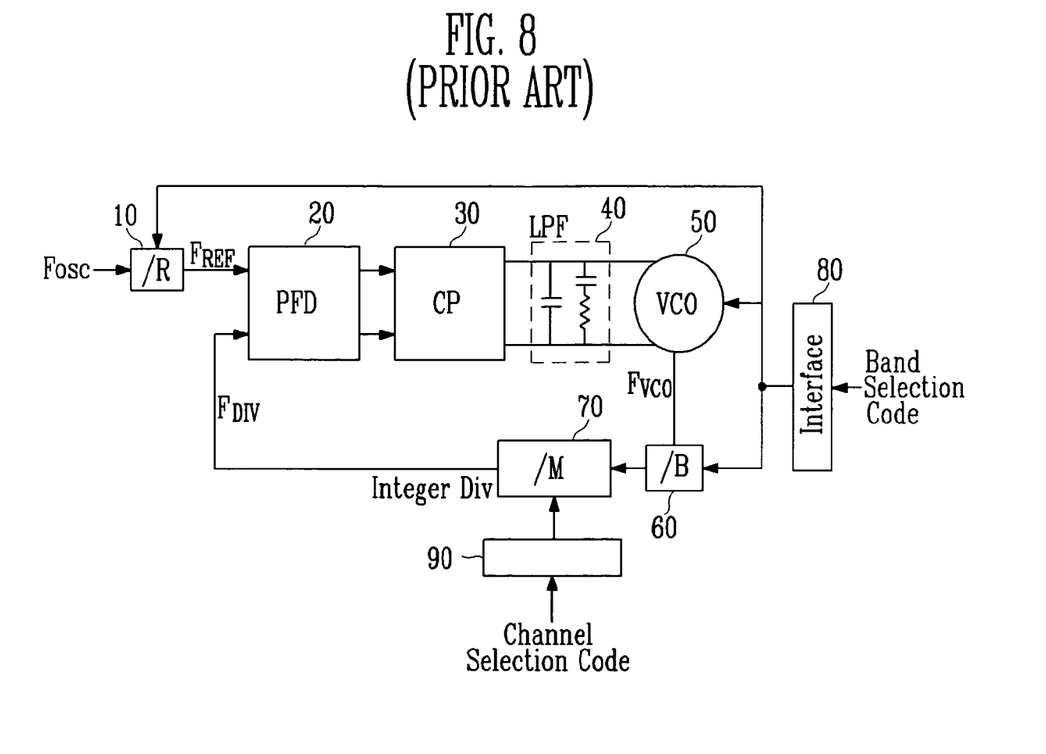
FIG. 8 is a block diagram of a conventional frequency synthesizer.

To manufacture the multiband multimode RF transceiver, a wide-band Local Oscillator (LO) are required. FIG. 8 illustrates a conventional wide-band frequency synthesizer including a phase frequency detector 20, a charge pump 30, a low pass filter 40, a voltage-controlled oscillator 50, and a variable frequency divider 70.

To satisfy requirements that vary depending on field of application when the frequency synthesizer for multiband multimode is manufactured, there should be a certain amount of flexibility in selecting components of the frequency synthesizer. However, use of a voltage-controlled oscillator, a high speed prescaler, a charge pump, and a loop filter diminishes flexibility in the construction of the frequency synthesizer. Therefore, a plurality of voltage-controlled oscillators and phase-locked loop (PLL) loops are used to manufacture the multiband frequency synthesizer. However, using a plurality of voltage-controlled oscillators and PLL loops results in increased chip size and power consumption.

SUMMARY OF THE INVENTION

The present invention is directed to a multiband multimode frequency synthesizer generating a wide-band (e.g., from 2 GHz to 9 GHz) frequency.

The present invention is also directed to a multiband wide-band frequency synthesizer capable of reducing an occupied area and electric power consumption by using a multimode prescaler.

The present invention is also directed to a wide-band frequency synthesizer with low noise using an inductor-switching voltage-controlled oscillator.

One aspect of the present invention provides a variable frequency divider for dividing an externally applied oscillation signal by a designated integer value and outputting the divided signal as a feedback signal, the variable frequency divider comprising: a prescaler for selecting one of a plurality of dual divisor value sets according to an external frequency selection signal; a main counter for counting the number of output pulses of the prescaler; and a swallow counter for designating an interval divided by a specific divisor value of the dual divisor value sets.

Another aspect of the present invention provides a frequency synthesizer including: a frequency/phase detector for comparing a frequency and phase of a reference high-frequency signal with a frequency and phase of a feedback high-frequency signal; a charge pump for producing an output current corresponding to the result of the comparison performed by the frequency/phase detector; a loop filter for producing an output voltage corresponding to an accumulated value of the output current of the charge pump; a voltage-controlled oscillator for generating an oscillation signal having a frequency corresponding to the output voltage of the loop filter; and a variable frequency divider for dividing an output signal of the voltage-controlled oscillator by a designated integer value, and outputting the result as a feedback signal, wherein at lease two of an amount of unit pumping charges of the charge pump, an RLC value of the loop filter, an RLC value of the voltage-controlled oscillator, and a divisor value of the variable frequency divider are controlled according to a band.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and fully enabling of practice of the present invention by those of ordinary skill in the art.

Figure 2:
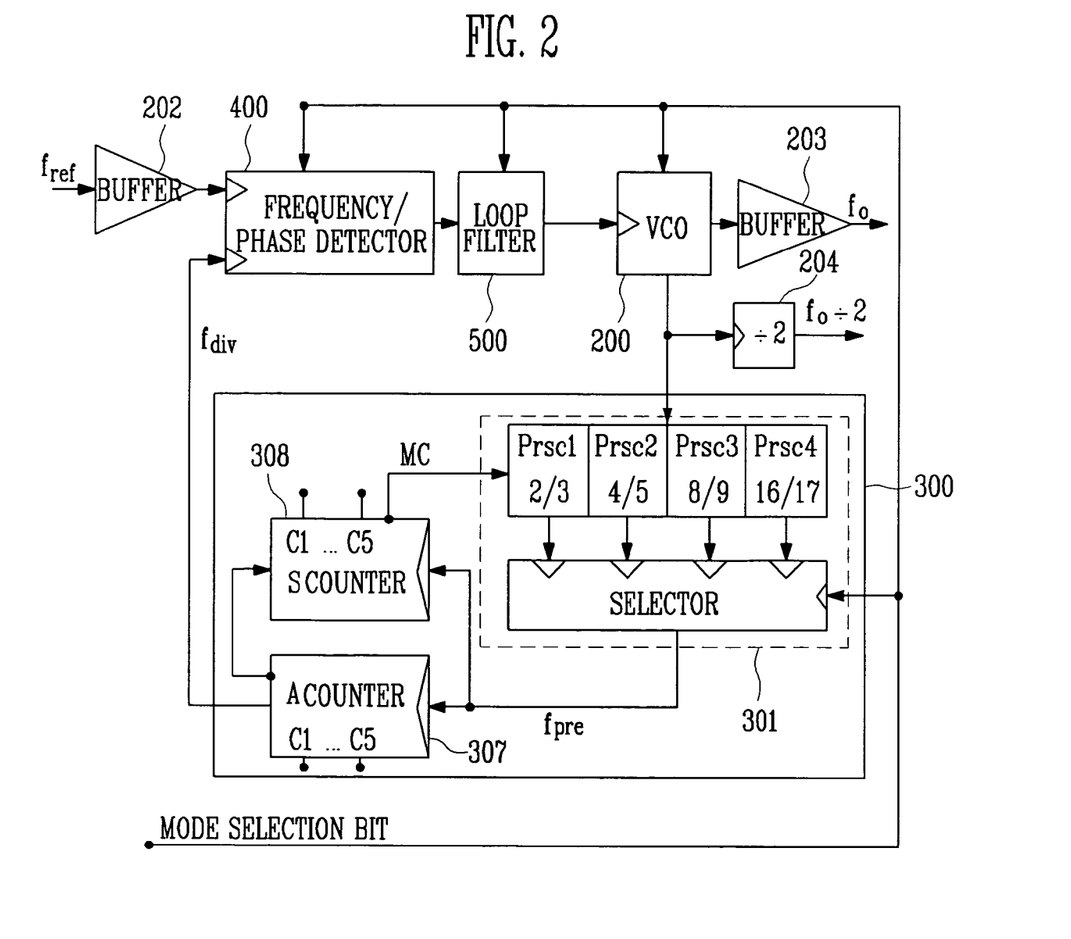
FIG. 2 is a block diagram of a wide-band multimode frequency synthesizer according to an exemplary embodiment of the present invention.

A frequency synthesizer illustrated in FIG. 2 includes a frequency/phase detector for comparing the frequency and phase of a reference high-frequency signal with the frequency and phase of a feedback high-frequency signal; a charge pump 400 for producing a current corresponding to the result of the comparison by the frequency/phase detector; a loop filter 500 for producing a voltage corresponding to an accumulated value of the output current of the charge pump; a voltage-controlled oscillator 200 for generating an oscillation signal having a frequency corresponding to the output voltage of the loop filter 500; and a variable frequency divider 300 for dividing the output signal of the voltage-controlled oscillator 200 by a designated integer value to output the divided signal as a feedback signal.

Here, the variable frequency divider 300 includes a prescaler 301 for selecting one of a plurality of dual divisor value sets, a main counter 307 for counting the number of output pulses of the prescaler 301, and a swallow counter 308 for designating an interval divided by a specific divisor value of the dual divisor value sets.

Meanwhile, when a system including the frequency synthesizer requires a divide-by-2 tuning clock in addition to a main tuning clock corresponding to a channel to be tuned, a 2-frequency divider 204 may be further included as illustrated.

Figure 1:
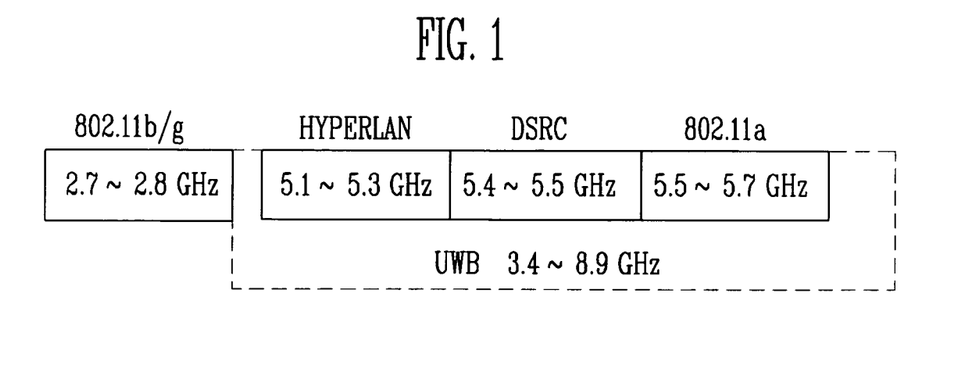
FIG. 1 illustrates frequency band allocation for 802.11b/g, HYPERLAN (HIgh PErformance Radio LAN), Dedicated Short Range Communications (DSRC), 802.11a, and Ultra Wide Band (UWB)

As illustrated in FIG. 1, a 802.11b/g system uses a frequency range of 2.7 GHz to 2.8 GHz, a HYPERLAN system uses a frequency range of 5.1 GHz to 5.3 GHz, a DSRC system uses a frequency range of 5.4 GHz to 5.5 GHz, a 802.11a system uses a frequency range of 5.5 GHz to 5.7 GHz, and a UWB system uses a frequency range of 3.2 GHz to 8.9 GHz.

A wide-band multimode frequency synthesizer on which a multimode prescaler is mounted as illustrated in FIG. 2 may be used for 802.11 b/g, HYPERLAN, DSRC, 802.11 a, and UWB systems according to a mode selection bit. A terminal having the wide-band frequency synthesizer of the present embodiment may select a desired frequency band for reception and transmission by adjusting the mode selection bit. Generally, the selection of the frequency band corresponds to selection of a communication method type, for example, selecting one of wireless LAN or Digital Multimedia Broadcasting (DMB).

The wide-band frequency synthesizer of FIG. 2 includes a phase frequency detector/switching charge pump 400, an adaptive loop filter 500, a wide-band LC tuning voltage-controlled oscillator 200 that can be switched, and a multimode variable frequency divider 300 in which a multimode prescaler is included. Also, it may further include an input buffer 202 for buffering a reference clock having a different frequency for each frequency band and/or an output buffer for buffering a clock output from the voltage-controlled oscillator 200.

The multimode variable frequency divider 300 that divides an externally applied oscillation signal by the designated integer value to output the result as a feedback signal includes a prescaler 301 for selecting one of a plurality of dual divisor value sets corresponding to a band selected according to an external frequency band selection signal, a main counter for counting the number of output pulses of the prescaler 307, and a swallow counter 308 for designating an interval divided by a specific divisor value of the dual divisor value sets.

The multimode prescaler 301 divides an output signal of the voltage-controlled oscillator 200 into a frequency corresponding to $f_{pre}$ of FIG. 2. The multimode prescaler 301 divides the output signal of the voltage-controlled oscillator 200 by 2/3, 4/5, 8/9 and 16/17 according to the mode selection bit, which is an externally applied control signal. According to the mode selection bit, the oscillation frequency of the voltage-controlled oscillator 200, a value of the loop filter 500 of FIG. 2, the amount of current of the charge pump 400 may be appropriately selected based on an application frequency band (802.11b/g, HYPERLAN, DSRC, 802.11a, and UWB) of FIG. 1.

The swallow counter 308 and the main counter 307 control the count according to setting bits C1 to C5. The oscillation frequency may be roughly or finely controlled according to the setting bits C1 to C5 and the mode selection bit.

That is, one of the illustrated four dual divisor value sets is selected by the mode selection bit, for example, when a second dual divisor value set (Prsc2) is selected. The main counter 307 counts the output signal $f_{pre}$ of the prescaler 301 tip to the number set by the setting bits C1 to C5, and the swallow counter 308 is set to count to a smaller number than the main counter 307 by the setting bits C1 to C5.

In the beginning, a signal output from the voltage-controlled oscillator 200 and divided-by-5 according to the second dual divisor value set Prsc2 is output from the prescaler 301. When the swallow counter finishes counting while the swallow counter and the main counter count the signal divided-by-5, a signal MC is input to the prescaler 301. The prescaler that receives the signal MC changes the divisor value into 4 and the main counter continues counting the remaining signals divided-by-4. Accordingly, the output signals $f_{div}$ of the main counter 307 may be result values divided by various divisor values according to a fixed output of the voltage-controlled oscillator.

Figure 3:
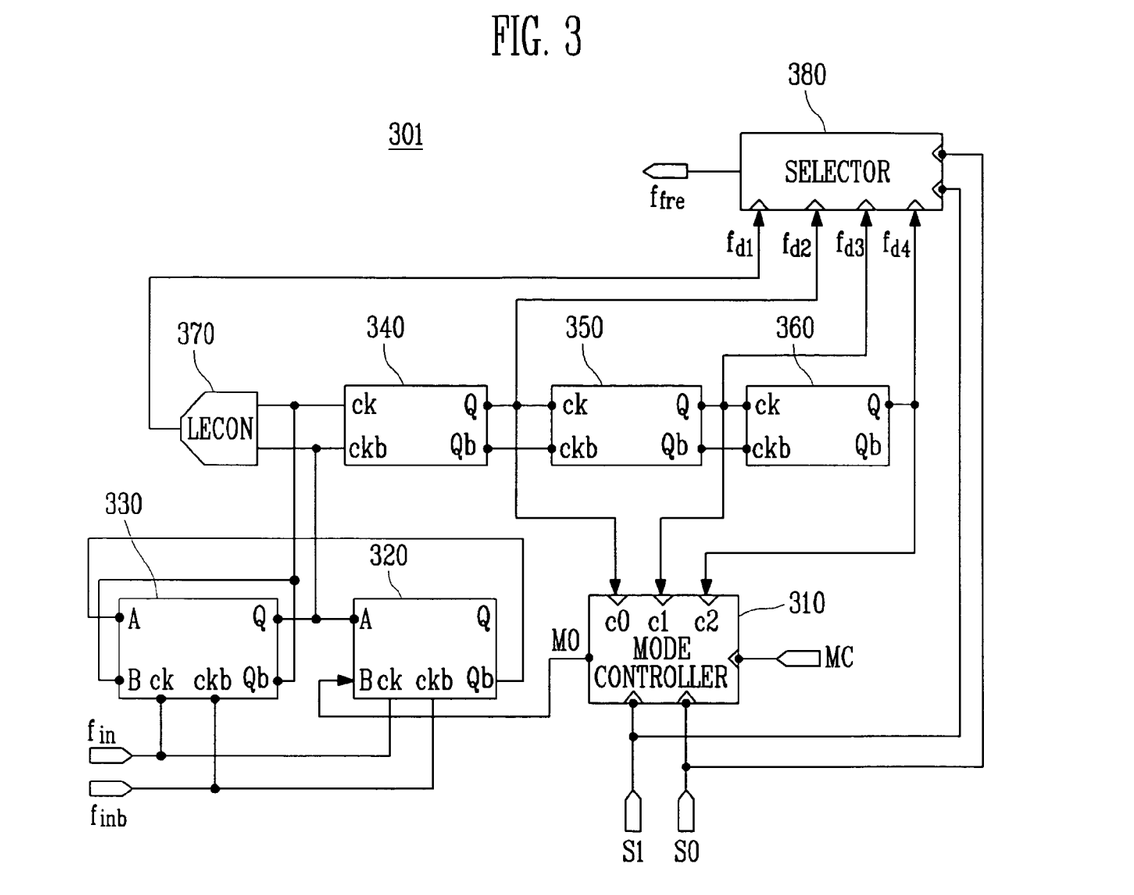
FIG. 3 is a circuit diagram of a multimode prescaler illustrated in FIG. 2 according to an exemplary embodiment of the present invention.

FIG. 3 illustrates a high-speed multimode prescaler 301 used for the wide-band frequency synthesizer of FIG. 2 according to the exemplary embodiment of the present invention. The illustrated multimode prescaler 301 includes two current-mode mode logic (CML) D flip-flops 320 and 330, three D flip-flops 340, 350 and 360, a mode controller 310, a selector 380, and a differential-to-single ended signal converter 370.

A multi-stage cascade-connected flip-flop comprises the three D flip-flops 340, 350 and 360 and a CML D flip-flop 330 among the components so that an initial stage receives the oscillation signal and counts to a multiple of 2. In addition, an additional flip-flop comprises another CML D flip-flop 320 so that the additional flip-flop receives the oscillation signal and supports a dual counting mode. The selector 380 selects one of output signals of the flip-flop output stages of the multi-stage cascade-connected flip-flop and outputs the selected signal, and the mode controller 310 controls operation of the additional flip-flop according to the output signal of the swallow counter.

The CML D flip-flops 320 and 330, which are high-speed frequency dividers for diving high output signals of the voltage-controlled oscillator 200, include AND logic or OR logic. The three D flip-flops 340, 350 and 360, which are frequency dividers for dividing a frequency divided by the CML D flip-flops 320 and 330 into a lower frequency, may be implemented as static logic or CML. The signal converter 370 is a circuit for converting a differential signal into a single signal. The selector 380 is implemented as a four-to-one multiplexer that selects one of signals $f_{d1}$, $f_{d2}$, $f_{d3}$ and $f_{d4}$ divided according to the mode selection bits S1 and S2 and outputs the selected signal as $f_{pre}$. The mode controller 310 of FIG. 3 receives an output signal $f_{d2}$ of the D flip-flop 1 340, an output signal $f_{d3}$ of the D flip-flop 2 350 and an output signal $f_{d4}$ of the D flip-flop 3 360, and generates an output signal MO according to a mode control input signal MC and mode control bits S1 and S0 of FIG. 3. According to the output signal MO, one of the operation modes of the multimode prescaler 301—divide-by-$\frac{2}{3}$, $\frac{4}{5}$, $\frac{8}{9}$ and $\frac{16}{17}$—is selected.

The mode control input signal MC is a setting signal generated by the swallow counter 308 of FIG. 2, and the output signal MO of the mode controller 310 is input to the CML D flip-flop 320 of FIG. 3. When the mode control bits are S1/S2=0/0, the prescaler 301 of FIG. 3 performs a divide-by-$\frac{2}{3}$ operation, when the mode control bits are S1/S2=0/1, the prescaler performs a divide-by-$\frac{4}{5}$ operation, when the mode control bits are S1/S2=1/0, the prescaler performs a divide-by-$\frac{8}{9}$ operation, and when the mode control bits are S1/S2=1/1, the prescaler performs a divide-by-$\frac{16}{17}$ operation.

Figure 4:
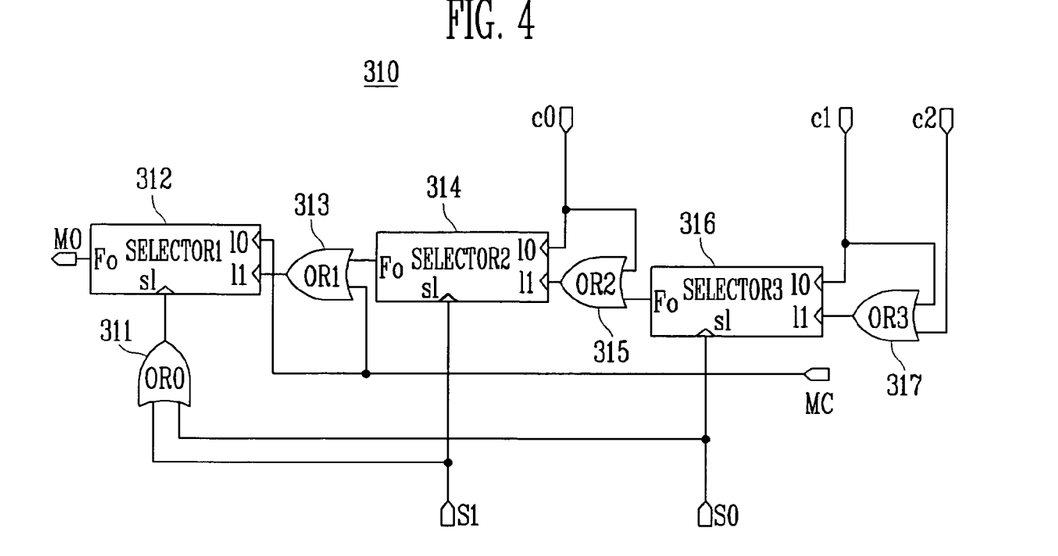
FIG. 4 is a circuit diagram of a mode controller illustrated in FIG. 3 according to an exemplary embodiment of the present invention.

FIG. 4 illustrates the mode controller 310 of FIG. 3 according to an exemplary embodiment of the present invention. Referring to FIG. 4, the mode controller 310 includes three two-to-one multiplexers 312, 314 and 316, and four OR gates 311, 313, 315 and 317. The mode controller 310 applies a result value obtained by performing OR and MUX operations on a plurality of signals generated by the multi-stage cascade-connected flip-flop 330, 340, 350 and 360 and the output signal MC of the swallow counter 308, to the flip-flop 320 as a control signal.

In FIG. 4, an output signal of the D flip-flop 1 340 of FIG. 3 is input to an input port C0 of FIG. 4, an output signal of the D flip-flop 2 350 of FIG. 3 is input to an input port C1, and an output signal of the D flip-flop 3 360 of FIG. 3 is input to an input port C2. The mode control signals S1 and S0 are input to selection terminals s1 of illustrated multiplexers 312, 314 and 316.

In the multiplexers 312, 314 and 316, when the selection terminals s1 are high, input terminals I1 of the multiplexers 312, 314 and 316 are selected, and when the selection terminals s1 are low, input terminals I0 of the multiplexers 312, 314 and 316 are selected. Describing operations of the mode controller 310 in more detail, when the mode control signal is S1/S0=0/0, the multiplexer 1 312 selects the input terminal I0. Therefore, after the setting signal of the swallow counter 308 of FIG. 2 is output at the output terminal MO through the input terminal MC, the setting signal is input to an input terminal B of the CML D flip-flop 1 320 of FIG. 3. As a result, the prescaler 301 finally performs the divide-by-$\frac{2}{3}$ operation.

Based on the above description, when the mode control signals are S1/S0=0/1, the multiplexer 312 selects the input terminal I1 and the multiplexer 2 314 selects the input terminal I0. Therefore, a signal formed by combining the setting signal of the swallow counter 308 of FIG. 2 and the signal $f_{d2}$ input through the input terminal C0 of FIG. 4 at OR1 313 of FIG. 4 is output at the output terminal MO and input to the input terminal B of the CML_D flip-flop 1 320 of FIG. 3 so that the prescaler 301 performs a divide-by-$\frac{4}{5}$ operation.

In addition, when the mode control signal is S1/S0=1/0, the multiplexer 1 312 of FIG. 4 selects the input terminal I1, the multiplexer 2 314 selects the input terminal I1, and the multiplexer 3 316 selects the input terminal I0. Therefore, after a signal formed by combining, at OR2 315 of FIG. 4 through OR1 313 of FIG. 4, the setting signal of the swallow counter 308 of FIG. 2, the signal $f_{d2}$ input through the input terminal C0 of FIG. 4, and the signal $f_{d3}$ input through the input terminal C1 of FIG. 4, is output at the output terminal MO of FIG. 4 and input to the input terminal B of the CML_D flip-flop 1 320 of FIG. 3 so that the prescaler 301 performs a divide-by-$\frac{8}{9}$ operation.

Further, when the mode control signal is S1/S0=1/1, the multiplexer 1 312 of FIG. 4 selects the input terminal I1, the multiplexer 2 314 selects the input terminal I1, and the multiplexer 3 316 selects the input terminal I1. Therefore, after a signal formed by combining, at OR1 313 of FIG. 4 through OR2 315 of FIG. 4, the setting signal of the swallow counter 308 of FIG. 2, the signal $f_{d2}$ input through the input terminal C0 of FIG. 4, the signal $f_{d3}$ input through the input terminal C1 of FIG. 4, and the signal $f_{d4}$ input through the input terminal C2 of FIG. 4, is output at the output terminal MO of FIG. 4 and input to the input terminal B of the CML_D flip-flop 1 320 of FIG. 3 so that the prescaler 301 performs a divide-by-$\frac{16}{17}$ operation. According to the present invention, the division ratio of the multimode prescaler 301 of FIG. 3 may be extended to 32/33, 64/65, 128/129, etc.

Figure 5:
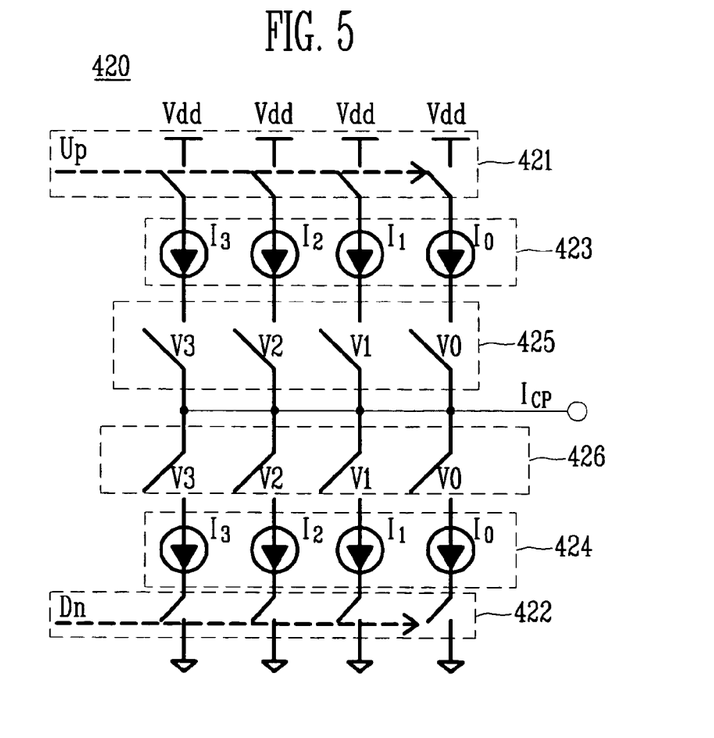
FIG. 5 is a circuit diagram of a charge pump illustrated in FIG. 1 according to an exemplary embodiment of the present invention.

The phase frequency detector/switching charge pump 400 of FIG. 2 consist of a phase frequency detector and a charge pump, and FIG. 5 illustrates an embodiment of the charge pump. The illustrated charge pump 420 has a structure that can switch current according to a corresponding mode in FIG. 2. In the charge pump 420 of FIG. 5, V0, V1, V2 and V3 are switches that are turned on or off according to the mode control signals S1 and S0 and control current of the charge pump 420. In the charge pump 420, four current sources I0, I1, I2 and I3 that constitute a plus current source block 423 have different sizes from four current sources I0, I1, I2 and I3 that constitute a minus current source block 424, and current from both sets of current sources is output or intercepted according to the on/off status of the switches V0 to V3. Up and Dn signals of FIG. 5 are generated at the phase frequency detector (not shown).

Figure 6:
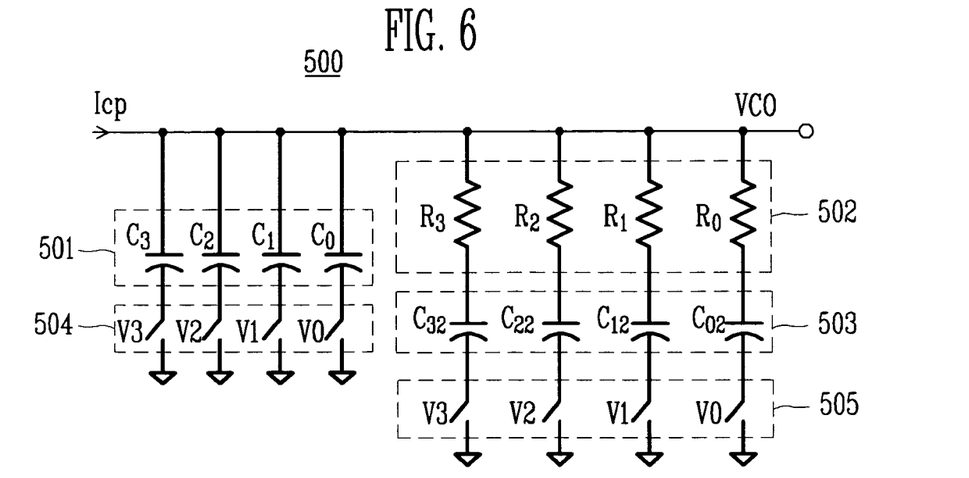
FIG. 6 is a circuit diagram of an adaptive loop filter illustrated in FIG. 1 according to an exemplary embodiment of the present invention.

FIG. 6 illustrates a loop filter 500 of FIG. 2. The loop filter 500 is a second order low-pass filter having a loop filter value set appropriately for a desired application band based on the on/off status of the switches V0 to V3 of FIG. 2 according to the mode control signals S1 and S0. In FIG. 2, capacitors $C_0$ to $C_3$ for storing electricity, resistors $R_0$ to $R_3$ for filtering, and capacitors $C_{02}$, $C_{12}$, $C_{22}$ and $C_{32}$ for filtering have different values from one another, their values being determined according to the application band of FIG. 1. The above method is applied to a third or fourth order loop filter.

Figure 7:
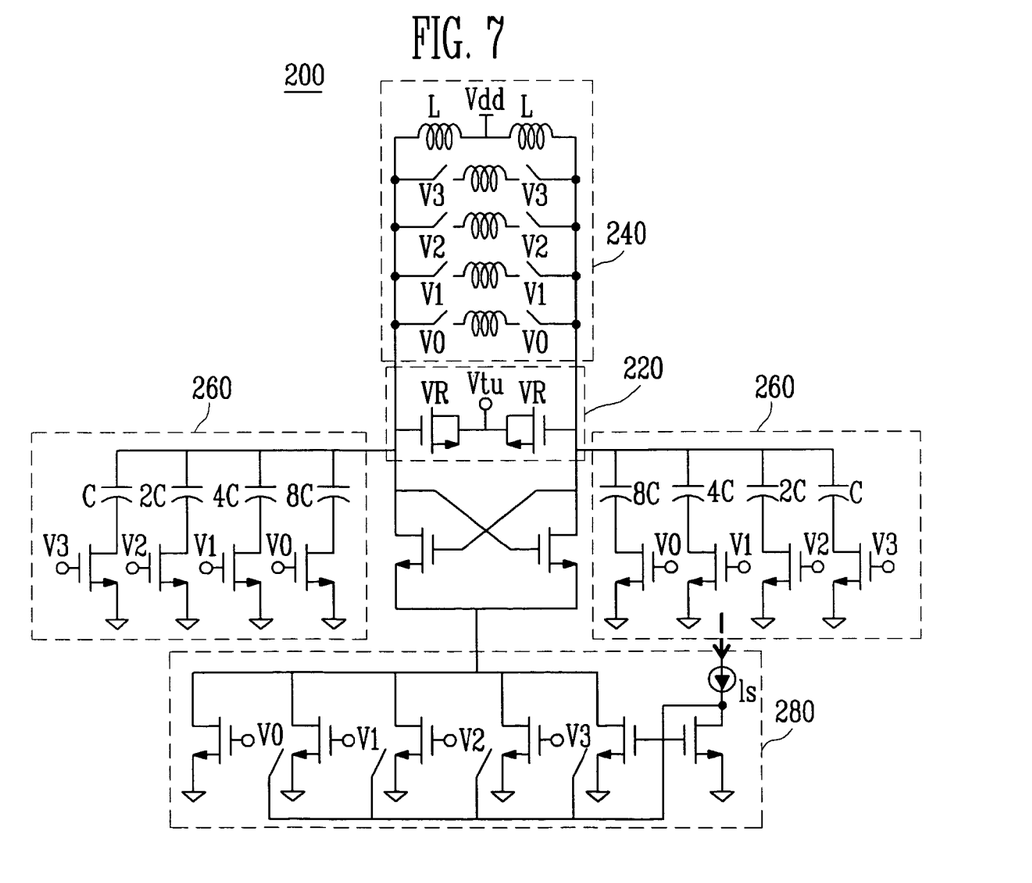
FIG. 7 is a circuit diagram of a wide-band LC tuning voltage-controlled oscillator having a switching function illustrated in FIG. 1 according to an exemplary embodiment of the present invention.

FIG. 7 illustrates the wide-band LC tuning voltage-controlled oscillator 200 of FIG. 2 according to an exemplary embodiment of the present invention. The voltage-controlled oscillator 200 of FIG. 7 includes an LC tuner comprising two inductors L and four switching inductors, two MOS varactors VR, and eight switching capacitors. The voltage-controlled oscillator 200 turns switches V0 to V3 on/off according to a combination of the mode control signals S1/S0 and the setting bits C1 to C5 of the program counter 307 of FIG. 2 to thereby generate a desired oscillation frequency and amplitude.

As described above, according to the mode control bit, which is an externally applied control signal, the divisor value of a variable divisor 300 is determined, a pumping charge of the charge pump 40 is determined, an RC integer value among circuit integer values of the loop filter 500 is determined, and an integer value of the oscillation circuit of the voltage-controlled oscillator and/or a current value of a tail current source are determined. Accordingly, even when a width of frequency fluctuation according to change in a frequency band is large, the frequency synthesizer can operate smoothly.

A multiband multimode frequency synthesizer of the present invention generates a multiband frequency that has a bandwidth range from several to several tens of GHz. Also, since a multimode prescaler is embedded in the frequency synthesizer of the present invention, occupied area and power consumption can be reduced.

In addition, the frequency synthesizer of the present invention uses an inductor-switching voltage-controlled oscillator to generate a wide-band oscillation frequency having a low noise characteristic.

Further, the frequency synthesizer of the present invention in which the multimode prescaler is embedded can generate a radio frequency within a band appropriate for a desired application according to a mode control signal.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A frequency synthesizer, comprising:

A frequency/phase detector for comparing a frequency and phase of a reference high frequency signal with a frequency and phase of a feedback high-frequency signal;

a charge pump for producing an output current corresponding to the result of the comparison performed by the frequency/phase detector;

a loop filter for producing an output voltage corresponding to an accumulated value of the output current of the charge pump;

a voltage-controlled oscillator for generating an oscillation signal having a frequency corresponding to the output voltage of the loop filter; and a variable frequency divider for dividing an output signal of the voltage controlled oscillator by a designated integer value and outputting the result as a feedback signal, wherein the variable frequency divider comprises: a prescaler for selecting one of a plurality of dual divisor value sets according to an external frequency selection signal;

a main counter for counting the number of output pulses of the prescaler;

and a swallow counter for designating an interval divided by a specific divisor value of the dual divisor value sets;

and wherein at leas(e)t two of an amount of unit pumping charges of the charge pump, a(n) RLC value of the loop filter, a(n) RLC value of the voltage-controlled oscillator, and a divisor value of the variable frequency divider are controlled according to a band.

2. The variable frequency divider according to claim 1, wherein the prescaler comprises:

a multi-stage cascade-connected flip-flop having a plurality of flip-flops, wherein an initial stage flip-flop of the multi-stage cascade-connected flip-flop receives the oscillation signal and counts to a multiple of 2;

an additional flip-flop for receiving the oscillation signal and supporting a dual counting mode;

a selector for selecting an output signal of an output stage of the multi-stage cascade-connected flip-flop according to a band and outputting the result; and a mode controller for controlling operation of the additional flip-flop according to an output signal of a swallow counter.

3. The variable frequency divider according to claim 2, wherein the mode controller applies a signal, among a plurality of signals generated by the multi-stage cascade-connected flip-flop, having a lower frequency than an output signal selected according to the band and a result value obtained by performing an OR operation on the output signal of the swallow counter, to the additional flip-flop as a control signal.

4. The variable frequency divider according to claim 2, wherein the initial stage flip-flop of the multi-stage cascade-connected flip-flop and the additional flip-flop are Current-Mode Logic (CML) flip-flops.

5. The frequency synthesizer according to claim 1, wherein the prescaler comprises:

a multi-stage cascade-connected flip-flop having a plurality of flip-flops, wherein an initial stage flip-flop of the multi-stage cascade-connected flip-flop receives the oscillation signal and counts to a multiple of 2;

an additional flip-flop for receiving the oscillation signal and supporting a dual counting mode;

a selector for selecting an output signal of an output stage of the multi-stage cascade-connected flip-flop according to the band and outputting the result; and a mode controller for controlling operation of the additional flip-flop according to an output signal of the swallow counter.

* * * * *